United States Patent
Han

(10) Patent No.: US 8,169,140 B2
(45) Date of Patent: May 1, 2012

(54) ORGANIC LIGHT EMITTING DISPLAY INCLUDING SPACER AND METHOD OF MANUFACTURING THE SAME

(75) Inventor: Dong-Won Han, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 280 days.

(21) Appl. No.: 12/140,614

(22) Filed: Jun. 17, 2008

(65) Prior Publication Data
US 2008/0315755 A1 Dec. 25, 2008

(30) Foreign Application Priority Data

Jun. 19, 2007 (KR) .................. 10-2007-0059726

(51) Int. Cl.
*H05B 33/04* (2006.01)
*H01J 9/26* (2006.01)

(52) U.S. Cl. ........ 313/512; 313/498; 313/504; 313/506; 445/24; 445/25

(58) Field of Classification Search ........... 313/504–512
See application file for complete search history.

(56) References Cited

U.S. PATENT DOCUMENTS

| 6,195,142 | B1 * | 2/2001 | Gyotoku et al. ............... 349/69 |
| 7,495,390 | B2 * | 2/2009 | Park et al. .................... 313/512 |
| 7,625,615 | B2 | 12/2009 | Kim et al. |
| 2003/0034497 | A1 * | 2/2003 | Yamazaki et al. ............ 257/86 |
| 2003/0164681 | A1 | 9/2003 | Fukuoka et al. |
| 2004/0169468 | A1 | 9/2004 | Peng |
| 2005/0053719 | A1 | 3/2005 | Ishida |
| 2005/0140291 | A1 * | 6/2005 | Hirakata et al. ............. 313/512 |
| 2005/0264182 | A1 * | 12/2005 | Seki ............................. 313/503 |
| 2006/0102913 | A1 * | 5/2006 | Park ............................. 257/89 |
| 2006/0192487 | A1 | 8/2006 | Choi et al. |
| 2006/0290271 | A1 | 12/2006 | Cok |
| 2006/0290276 | A1 * | 12/2006 | Cok et al. .................... 313/512 |
| 2008/0136319 | A1 * | 6/2008 | Yoon ........................... 313/504 |
| 2009/0009055 | A1 * | 1/2009 | Han et al. .................... 313/498 |

FOREIGN PATENT DOCUMENTS

| EP | 1670081 A2 | 6/2006 |
| JP | 2002-231441 | 8/2002 |
| JP | 2005-044613 | 2/2005 |
| JP | 2005-158750 | 6/2005 |

(Continued)

OTHER PUBLICATIONS

Office Action issued in Korean Patent Application No. 2007-59726 on May 22, 2008.

(Continued)

*Primary Examiner* — Sikha Roy
(74) *Attorney, Agent, or Firm* — Robert E. Bushnell, Esq.

(57) ABSTRACT

An organic light emitting display, and a method of manufacturing the same, the organic light emitting display including: a substrate including thin film transistors (TFTs) formed on a surface thereof; organic light emitting diodes (OLEDs) disposed on the TFTs; an encapsulating unit that encapsulates the OLEDs; and spacers formed on the encapsulating unit. The OLEDs include first electrodes electrically connected to the TFTs, a pixel defining layer formed around the first electrodes, organic thin layers formed on the first electrodes, and second electrodes formed on the organic thin layers. The spacer is formed of moisture absorbing material, and faces the pixel defining layer.

25 Claims, 7 Drawing Sheets

FOREIGN PATENT DOCUMENTS

| | | |
|---|---|---|
| JP | 2005-166315 | 6/2005 |
| JP | 2006-236963 | 9/2006 |
| JP | 2006-269257 | 10/2006 |
| KR | 2006-103047 | 9/2006 |
| KR | 2006-103048 | 9/2006 |
| WO | 2006101378 | 9/2006 |

OTHER PUBLICATIONS

Office Action issued by Japanese Patent Office in Japanese Patent Application 2008-079891 on Jun. 1, 2010.

Office Action issued Chinese Patent Application No. 200801102153 on Jun. 5, 2009.

Extended European Search Report issued by EPO, dated Jan. 28, 2011, corresponding to European Patent Application No. 08252109.7.

Japanese Office Action issued by JPO on Nov. 1, 2011 in connection with Japanese Patent Application Serial No. 2008-079891, which also claims Korean Patent Application Serial No. 10-2007-0059726 as its priority document, and Request for Entry of the Accompanying Office Action attached herewith.

* cited by examiner

A

B

ORGANIC LIGHT EMITTING DISPLAY INCLUDING SPACER AND METHOD OF MANUFACTURING THE SAME

CROSS-REFERENCE TO RELATED APPLICATION

This application claims the benefit of Korean Application No. 2007-59726, filed Jun. 19, 2007, in the Korean Intellectual Property Office, the disclosure of which is incorporated herein by reference.

BACKGROUND

1. Field of the Invention

Aspects of the present invention relate to an organic light emitting display, and a method of manufacturing the same, and more particularly, to an organic light emitting display including spacers, and a method of manufacturing the same.

2. Description of the Related Art

An organic light emitting display is a self-emission type display that electrically excites phosphorous organic compounds to generate light. An organic light emitting display can be driven with a low voltage, can be made small and slim, can have a wide viewing angle, and can have a high response speed. Therefore, organic light emitting displays are spotlighted as next generation displays, and in particular, displays for mobile applications.

Organic thin layers, of the organic light emitting diodes (OLEDs) that constitute the pixels of an organic light emitting display, are formed of organic materials. The organic materials can be damaged, if contacted by oxygen and/or moisture, which can result in a reduction of the lifespan of an organic light emitting display. Therefore, methods of encapsulating OLEDs, to prevent the exposure of the OLEDs to oxygen and moisture, are used. However, the conventional encapsulating methods cannot sufficiently prevent such an exposure from occurring.

FIG. 1 is a cross-sectional view illustrating a conventional organic light emitting display 100. Referring to FIG. 1, the organic light emitting display 100 includes a substrate 110 including thin film transistors (TFTs) 120, organic light emitting diodes (OLEDs), and an encapsulating unit 170 that encapsulates the OLEDs. The OLEDs include: first electrodes 130 that are electrically connected to the TFTs 120; a pixel defining layer 140 formed around the first electrodes 130; organic thin layers 150 formed on the first electrodes 130; and second electrodes 160 formed on the organic thin layers 150.

A plurality of the TFTs 120 are formed on the surface of the substrate 110. The OLEDs are electrically connected to the TFTs 120, and are formed on the TFTs 120. When a predetermined voltage is applied to the first electrodes 130 and the second electrodes 160, holes from the first electrodes 130, and electrons from the second electrodes 160, move to the organic thin layers 150 to generate excitons. As the excitons are grounded from an excited state to a ground state, the phosphorous molecules of the organic thin layers 150 emit light to realize an image.

The encapsulating unit 170 is formed of glass or metal, in order to prevent moisture and/or oxygen from permeating into the OLEDs. A sealing material 190 is applied on the edge of the encapsulating unit 170, to attach the substrate 110 to the encapsulating unit 170. However, moisture and oxygen may be present between the substrate 100 and the encapsulating unit 170, so the OLEDs may still be damaged.

In addition, when pressure is applied from the outside to the encapsulating unit 170, the encapsulating unit 170 may be damaged, or may be curved toward the substrate 110 where the OLEDs are formed, thereby damaging the OLEDs. That is, the encapsulating unit 170 is bent toward the substrate 110, so as to contact the second electrodes 160 formed on the organic thin layers 150, or pressure is applied to the second electrodes 160, so that the organic thin layers 150 are damaged.

SUMMARY OF THE INVENTION

Aspects of the present invention provide an organic light emitting display including spacers that absorb moisture, so as to protect organic light emitting diodes (OLEDs) from oxygen and/or moisture, and to improve the mechanical strength of the organic light emitting display.

According to aspects of the present invention, there is provided an organic light emitting display including: a substrate including thin film transistors (TFTs), organic light emitting diodes (OLEDs), an encapsulating unit that encapsulates the OLEDs, and spacers formed on one side of the encapsulating unit. The OLEDs include first electrodes that are electrically connected to the TFTs, a pixel defining layer disposed around the first electrodes, organic thin layers formed on the first electrodes, and second electrodes formed on the organic thin layer. The spacers are formed of a moisture absorbing material, and can face a portion of the pixel defining layer.

According to aspects of the present invention, the spacers are formed on the internal surface of the encapsulating unit, facing at least a portion of the pixel defining layer. The pixel defining layer has a thickness of 0.05 to 0.3 µm. The moisture absorbing material is at least one selected from the group consisting of barium oxide, potassium oxide, calcium oxide, aluminum oxide, lithium sulfate, sodium hydrosulfite, calcium sulfate, magnesium sulfate, cobalt sulfate, gallium sulfate, titanium sulfate, calcium chloride, calcium nitrate tetrahydrate, magnesium oxide, alkali metal oxide, alkali earth metal oxide, metal halide, lithium sulfate, a metal chloride, a metal perchlorate, phosphorous pentoxide, and nickel sulfate. The spacers have a thickness of 3 to 5 µm. The encapsulating unit can be an encapsulating substrate, or an encapsulating thin layer. An organic and an inorganic layer (or multiple layers thereof) are alternately laminated to form the encapsulating thin layer. The organic light emitting display further includes a sealing material to attach the substrate to the encapsulating unit. The sealing material is an inorganic sealing material.

According to aspects of the present invention, there is provided a method of fabricating an organic light emitting display, comprising: forming a substrate including TFTs; forming first electrodes that are electrically connected to the TFTs; forming pixel a defining layer around the first electrodes; forming organic thin layers and second electrodes on the first electrodes; forming a spacer, which is formed of moisture absorbing material, on the internal surface of the encapsulating unit; and attaching the encapsulating unit onto the substrate. The encapsulating unit is separated from the second electrodes, by a predetermined distance. The organic thin layers are formed by a laser induced thermal imaging (LITI) method. The spacer is formed by one of a deposition method, a screen printing method, and a spraying method. A shadow mask can be used for the deposition or screen printing method.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
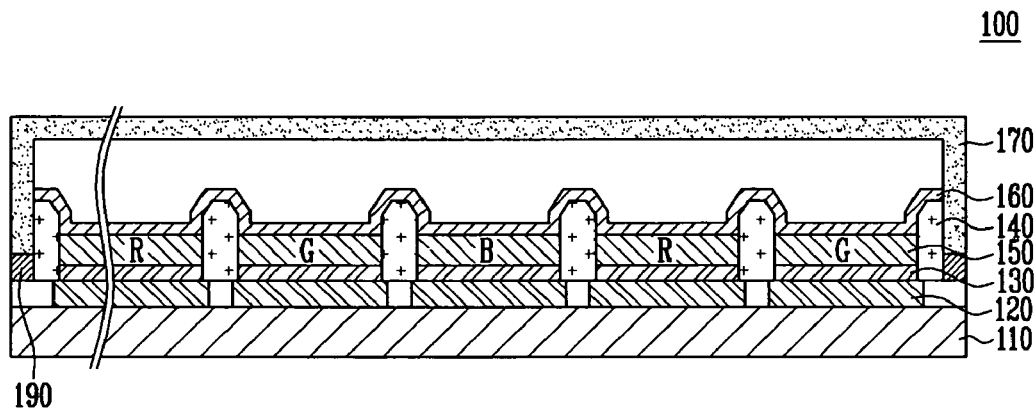
FIG. 1 is a cross-sectional view illustrating an exemplary organic light emitting display.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. As referred to herein, when a first element is said to be "disposed" on, or adjacent to, a second element, the first element can directly contact the second element, or can be separated from the second element by one or more other elements can be located therebetween.

Figure 2:
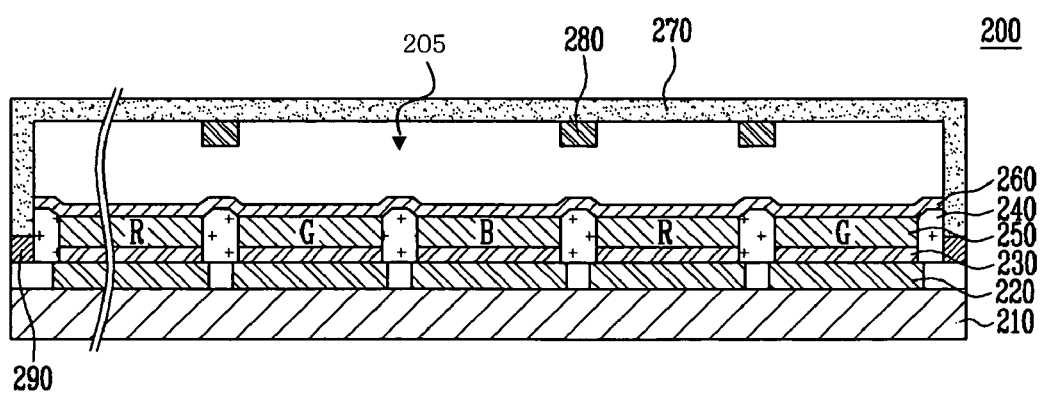
FIG. 2 is a cross-sectional view illustrating an organic light emitting display, according to a first exemplary embodiment of the present invention.

FIG. 2 is a cross-sectional view illustrating an organic light emitting display 200, according to a first exemplary embodiment of the present invention. Referring to FIG. 2, the organic light emitting display 200 includes a substrate 210, thin film transistors (TFTs) 220 formed on the substrate 210, organic light emitting diodes (OLED) 205 formed on the TFTs, an encapsulating unit 270 that encapsulates the OLEDs 205, and spacers 280 formed on one side of the encapsulating unit 270, facing at least a portion of the pixel defining layer 240. The OLEDs 205 include: first electrodes 230 electrically connected to the TFTs 220; a pixel defining layer 240 formed around the first electrodes 230; organic thin layers 250 formed on the first electrodes 130; and second electrodes 260 formed on the organic thin layers 250.

The spacers 280 are formed on the internal surface of the encapsulating unit 270, facing a portion of the pixel defining layer 240. The pixel defining layer 240 separates the OLEDs 205 from each other, and can assist the operation of the spacers 280. The spacers 280 allow for a reduction in the thickness of the pixel defining layer 240.

The pixel defining layer 240 can be formed to have a thickness of 0.05 to 0.3 µm. The pixel defining layer 240 can be multiple separate layers. When the thickness of the pixel defining layer 240 is less than about 0.05 µm, the first electrodes 230 and the second electrodes 260 can form short circuits. When the thickness of the pixel defining layer 240 is larger than about 0.3 µm, it may become difficult to uniformly form the organic thin layers 250. For example, if a mask (not shown) is used to form the organic thin layer 250, and the thickness of the pixel defining layer 240 is large, the distance between the mask and the region in which the organic thin layers 250 are formed, is large, so that the organic thin layers may not be uniformly formed.

If the organic thin layers 250 are formed using laser induced thermal imaging (LITI), and the thickness of the pixel defining layer 240 is less than about 0.3 µm, the organic thin layers 250 may not be uniformly formed. That is, the distance between a donor film and the organic thin layers 250 is very small, so the organic thin layers 250 may not be uniformly formed. In particular, the edges of the organic thin layers 250 may not be uniformly formed.

When the pixel defining layer 240 is formed to a thickness of 0.05 to 0.3 µm, the step difference, between the pixel defining layer 240 and the first electrodes 230, is reduced, and the organic thin layers 250 can be uniformly formed. That is, the thickness of the pixel defining layer 240 is reduced by 0.95 to 1.45 µm, as compared with the thickness of conventional pixel defining layers, which have a thickness of 1 to 1.5 µm. Therefore, the step difference, between the pixel defining layer 240 and the first electrodes 230, is reduced.

The spacers 280 allow for the thickness of the pixel defining layer 240 to be reduced, so that the organic thin layers 250 can be uniformly formed using the LITI method or the mask method. That is, the thickness of the pixel defining layer 240 is decreased, to reduce the distance between the mask (not shown) provided on the pixel defining layer 240, or the donor film 300 (FIG. 4B) and the first electrodes 230. As a result, the organic thin layers 250 can be correctly formed on the first electrodes 230.

Red, green, and blue organic thin layers 250 are formed on the first electrodes 230, in voids formed therein. After forming the organic thin layers 250, color filters are formed in the encapsulating unit 170, to realize red, green, and blue OLEDs 205 (pixels). The second electrodes 260 are formed on the pixel defining layer 240 and the organic thin layers 250, to complete the OLEDs 205.

The encapsulating unit 270 faces the substrate 210, and is separated from the second electrodes 260. The encapsulating unit 270 can be formed of an encapsulating substrate, or an encapsulating thin layer. The encapsulating unit 270 can be shaped as a rectangular prism having an open bottom. The encapsulating substrate 270 can be attached to the substrate 210, by a sealing material 290 applied to the edge of the open bottom of the encapsulating substrate 270.

The spacers 280 face a portion of the pixel defining layer 240. When pressure is applied to the encapsulating substrate 270, the spacers 280 contact the second electrodes 260 that are formed on the corresponding portion of the pixel defining layer 240. As a result, it is possible to prevent the encapsulating substrate 270 from contacting the second electrodes 260.

The spacers 280 are formed of a moisture absorbing material, to prevent the OLEDs 205 from being damaged by moisture and/or oxygen. The spacers 280 can be formed of one selected from the group consisting of barium oxide, potassium oxide, calcium oxide, aluminum oxide, lithium sulfate, sodium hydrosulfite, calcium sulfate, magnesium sulfate, cobalt sulfate, gallium sulfate, titanium sulfate, calcium chloride, calcium nitrate tetrahydrate, magnesium oxide, alkali metal oxide, alkali earth metal oxide, metal halide, lithium sulfate, a metal chloride, a metal perchlorate, phosphorous pentoxide, and nickel sulfate.

The spacers 280 can have a thickness of 3 to 5 μm. When the thickness of the spacers 280 is less than about 3 μm, the organic thin layers 250 can be damaged, if the encapsulating unit 270 is forced toward the substrate 210. When the thickness of the spacers 280 is more that about 5 μm, the thickness of the organic light emitting display 200 may be unnecessarily increased.

Figure 3A:
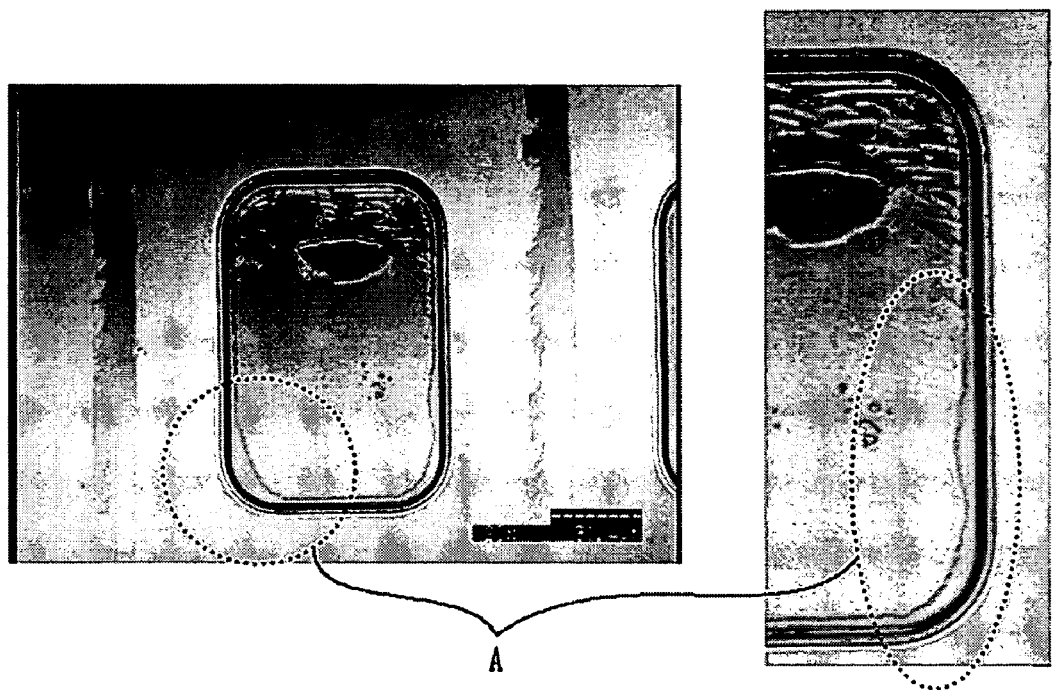
FIGS. 3A and 3B are micrographs illustrating the surface of an organic thin layer.
Figure 3B:
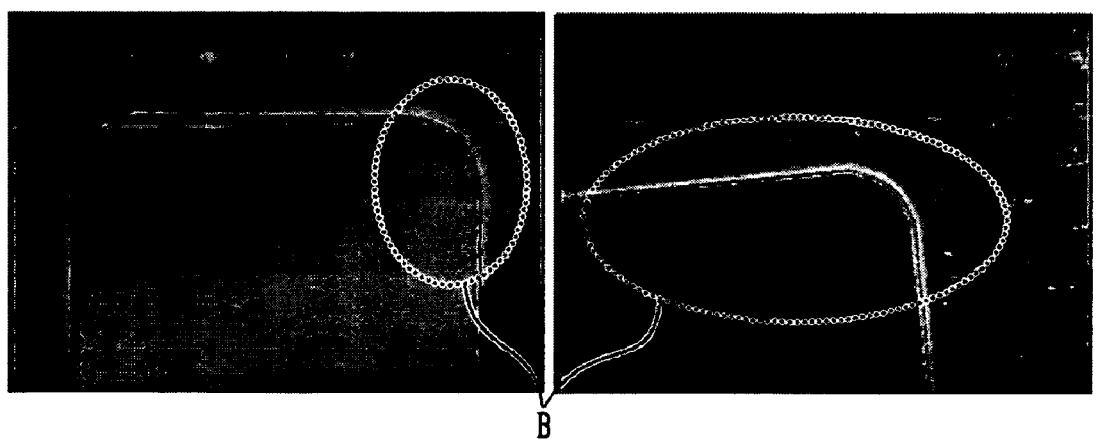

FIGS. 3A and 3B are micrographs illustrating the surface of the organic thin layer 250. FIG. 3A illustrates the case in which an organic thin layer is formed by the LITI method, and the thickness of pixel defining layer is 1.5 μm. As shown, the organic thin layer in region A is not uniformly formed. FIG. 3B illustrates the case in which an organic thin layer is formed by the LITI method, and the thickness of pixel defining layer is 0.2 μm. As shown, the organic thin layer in region "B" is uniformly formed.

As described above, the organic thin layers are more uniformly formed when the thickness of the pixel defining layer is relatively smaller. That is, a thinner pixel defining layer minimizes the distance between the region in which the organic thin layers are to be formed, and the donor film, to uniformly form the organic thin layers.

Figure 4A:
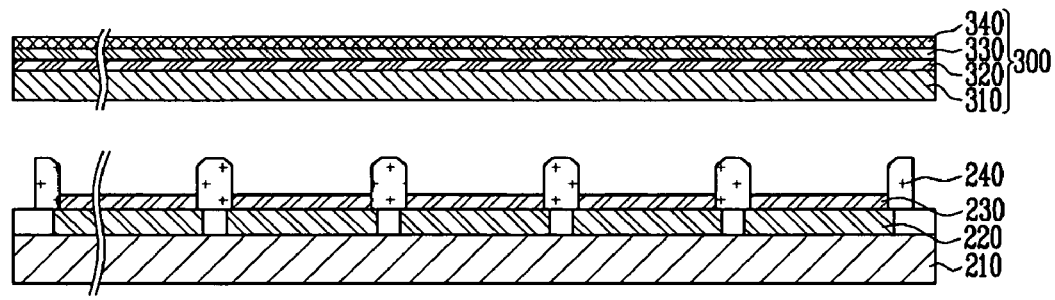
FIGS. 4A to 4F illustrate a method of manufacturing the organic light emitting display, according to the first exemplary embodiment of the present invention.

FIGS. 4A to 4F illustrate a method of manufacturing the organic light emitting display 200, according to an exemplary embodiment of the present invention. Referring to FIG. 4A, the substrate 210 having the TFTs 200, is provided. The first electrodes 230 are electrically connected to the TFTs 220, and the pixel defining layer 240 is formed between the first electrodes 230. A donor film 300, including a base substrate 340, a photo-thermal converting layer 330 formed on the base substrate 340, an intermediate layer 320 formed on the photo-thermal converting layer 330, and the transfer layer 310 formed on the intermediate layer 320, is provided. The donor film 300 is disposed over the substrate 210, with the transfer layer 310 facing the substrate 210.

Figure 4B:
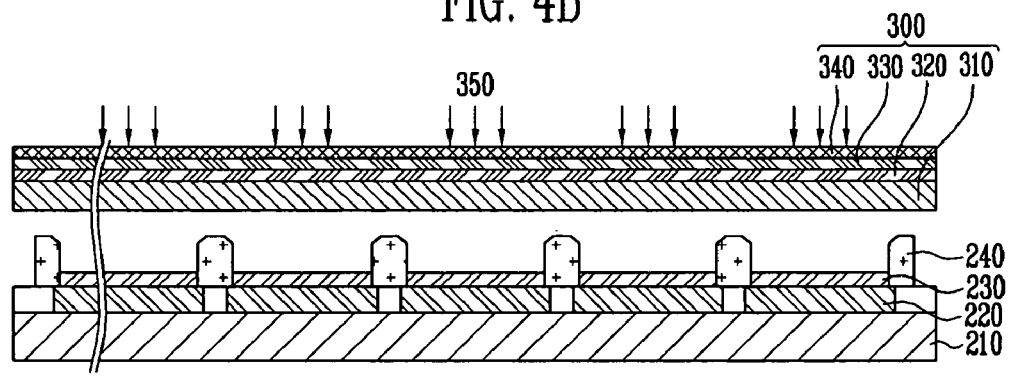

Referring to FIG. 4B, the donor film 300 is laminated on the substrate 210. To transfer the transfer layer 310, in a subsequent transfer process, the lamination is performed so that the donor film 300 is well attached to the substrate 210. For example, the donor film 300 can be laminated onto the accepter substrate 210, using a roller.

Since the step difference, between the pixel defining layer 240 and the first electrodes 230, is reduced, the organic thin layers 250 can be uniformly formed on the first electrodes 230. A laser beam 350 is radiated onto portions of the donor film 300, corresponding to where the organic thin layers 250 are to be formed.

Figure 4C:
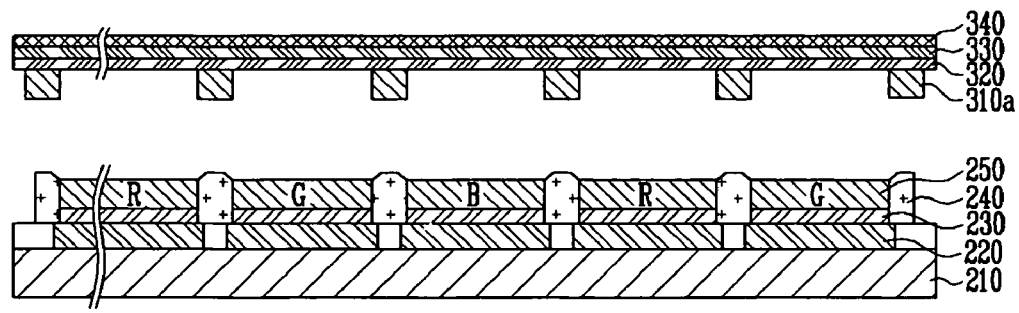

Referring to FIG. 4C, when the laser beam 350 is radiated onto the donor film 300, the photo-thermal converting layer 330 converts the laser beam into thermal energy. Therefore, the attaching force changes between the transfer layer 310 and the intermediate layer 320, so that the transfer layer 310 can be separated from the donor film 300. As a result, the transfer layer 310 is transferred to the substrate 210, to form the organic thin layers 250. The transfer layer 310 is transferred only where the laser beam 350 is radiated. Non-radiated portions of the transfer layer 310a remain on the donor film 300. The above-described method of forming the organic thin layers 250 is referred to as a LITI method. However, the organic thin layers 250 can also be formed by a common deposition method.

Figure 4D:
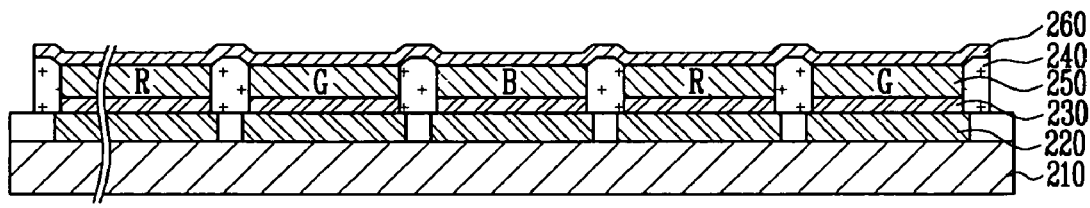

Referring to FIG. 4D, after the donor film 300 and the substrate 210 are separated from each other, and the second electrodes 260 are formed on the pixel defining layer 240 and the organic thin layers 250.

Figure 4E:
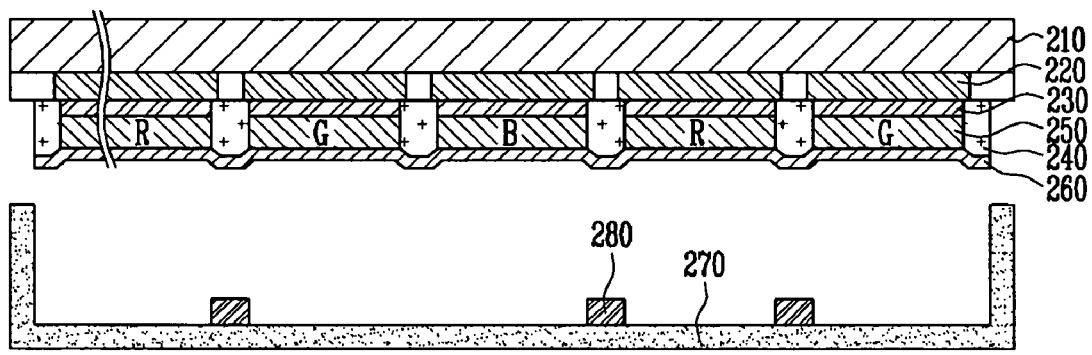

Referring to FIG. 4E, the spacers 280 are formed on the internal surface of the encapsulating substrate 270, so as to face a portion of the pixel defining layer 240. The spacers 280 can have a thickness of 3 to 5 μm. The spacers 280 can be formed by a screen printing method, a spraying method, or a deposition method. However, the method of forming the spacers 280 is not limited to the above. For example, when the spacers 280 are formed using the deposition and screen printing methods, foreign substances on the internal surface of the encapsulating substrate 270, where the spacers 280 are to be formed, are removed. Then, a shadow mask that corresponds to a portion of the pixel defining layer 240 is provided, to form the spacers 280 on the internal surface of the encapsulating substrate 270. In addition, a moisture absorbing material can be applied to the spacers 280 using a squeegee, to harden the spacers 280.

Figure 4F:
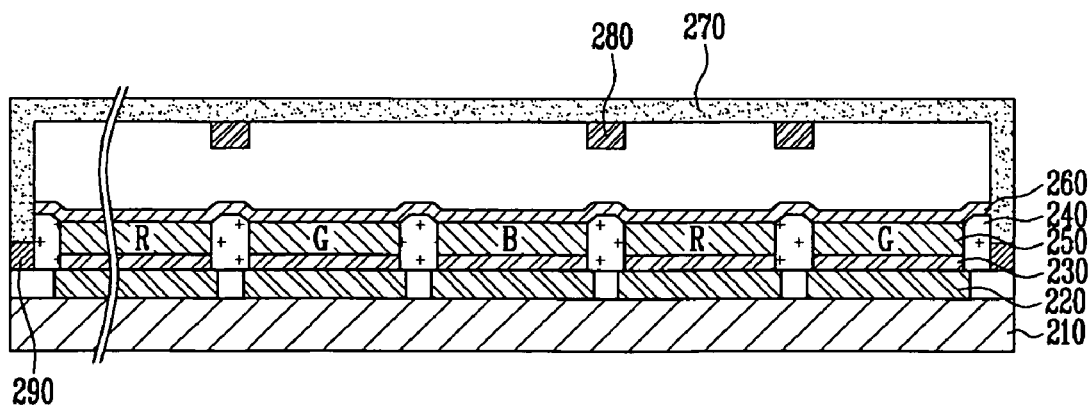

Referring to FIG. 4F, the sealing material 290 is applied to the outer perimeter of the encapsulating substrate 270. The encapsulating substrate 270 is attached to the substrate 210, using the sealing material 290.

Figure 5:
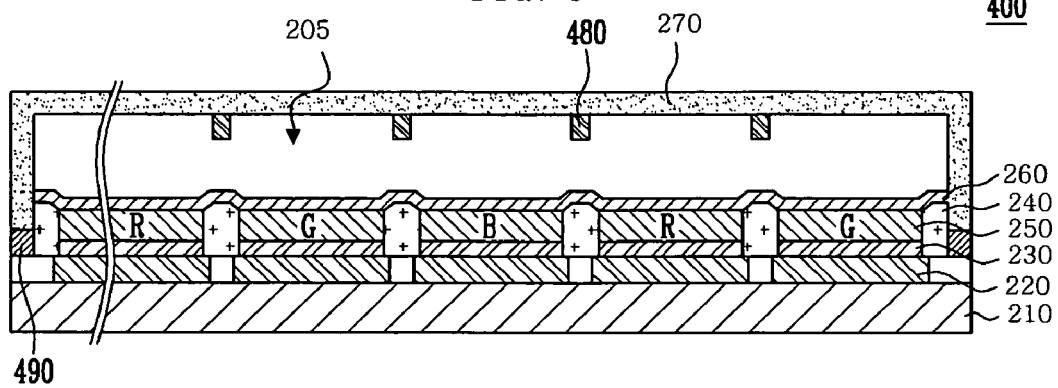
FIG. 5 is a cross-sectional view of an organic light emitting display, according to a second exemplary embodiment of the present invention.

FIG. 5 is a cross-sectional view of an organic light emitting display 400, according to a second exemplary embodiment of the present invention. The organic light emitting display 400 is similar to the organic light emitting display 200. Similar components have the same reference numbers, and are not described in detail.

Referring to FIG. 5, an organic light emitting display 400 includes a substrate 210, thin film transistors (TFTs) 220 formed on the substrate 210, organic light emitting diodes (OLEDs) 205 formed on the TFTs, an encapsulating unit 270 that encapsulates the OLEDs 205, and spacers 480 formed on one side of the encapsulating unit 270. The OLEDs 205 include: first electrodes 230 electrically connected to the TFTs 220; a pixel defining layer 240 formed around the first electrodes 230; organic thin layers 250 formed on the first electrodes 130; and second electrodes 260 formed on the organic thin layers 250. The spacers 480 face a portion of the pixel defining layer 240. The pixel defining layer 240 can have a thickness of 0.05 to 0.3 μm. The spacers 480 can have a thickness of 3 to 5 μm, and can be formed of the oxygen absorbing material.

The spacers 480 are formed of the moisture absorbing material, to protect the OLEDs 205 against oxygen and moisture, and to prevent encapsulating unit 470 from contacting the OLEDs. In addition, since the spacers 480 include a moisture absorbent, and additional moisture absorbent is not needed, thereby reducing manufacturing complexity. Therefore, the manufacturing processes of the organic light emitting display 400 can be reduced.

Figure 6:
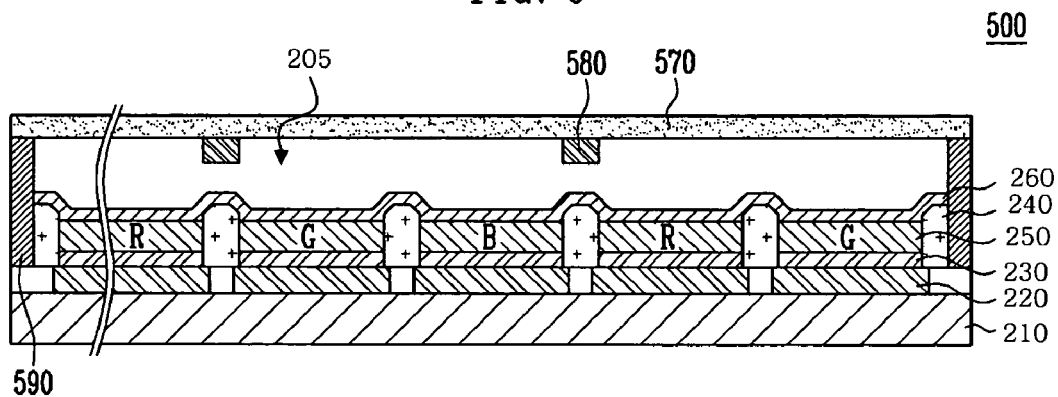
FIG. 6 is a cross-sectional view of an organic light emitting display, according to a third exemplary embodiment of the present invention.

FIG. 6 is a cross-sectional view of an organic light emitting display 500, according to a third exemplary embodiment of the present invention. The organic light emitting display 500 is similar to the organic light emitting display 200. Similar components have the same reference numbers, and are not described in detail. Referring to FIG. 6, the organic light emitting display 500 includes a substrate 210, thin film transistors (TFTs) 220 formed on the substrate 210, organic light emitting diodes (OLEDs) 205 formed on the TFTs, an encapsulating unit 570 that encapsulates the OLEDs 205, and a spacer 580 formed on one side of the encapsulating unit 570.

The OLEDs 205 include: first electrodes 230 electrically connected to the TFTs 220; a pixel defining layer 240 formed around the first electrodes 230; organic thin layers 250 formed on the first electrodes 130; and second electrodes 260 formed on the organic thin layers 250. The spacer 580 faces a portion of the pixel defining layer 240.

The encapsulating unit 570 is generally flat, to reduce the distance between the substrate 210 and the encapsulating substrate 570, and to reduce the thickness of the organic light emitting display 500. The encapsulating substrate 570 can be attached to the substrate 510, by a sealing material 590 applied to the outer perimeter of the encapsulating substrate 570. The sealing material 590 can be an inorganic sealing material. The inorganic sealing material can be glass frits. For example, the glass frits can include at least one selected from the group consisting of $K_2O$, $Fe_2O_3$, $Sb_2O_3$, $ZnO$, $P_2O_5$, $V_2O_5$, $TiO_2$, $Al_2O_3$, $B_2O_3$, $WO_3$, $SnO$, and $PbO$.

Figure 7:
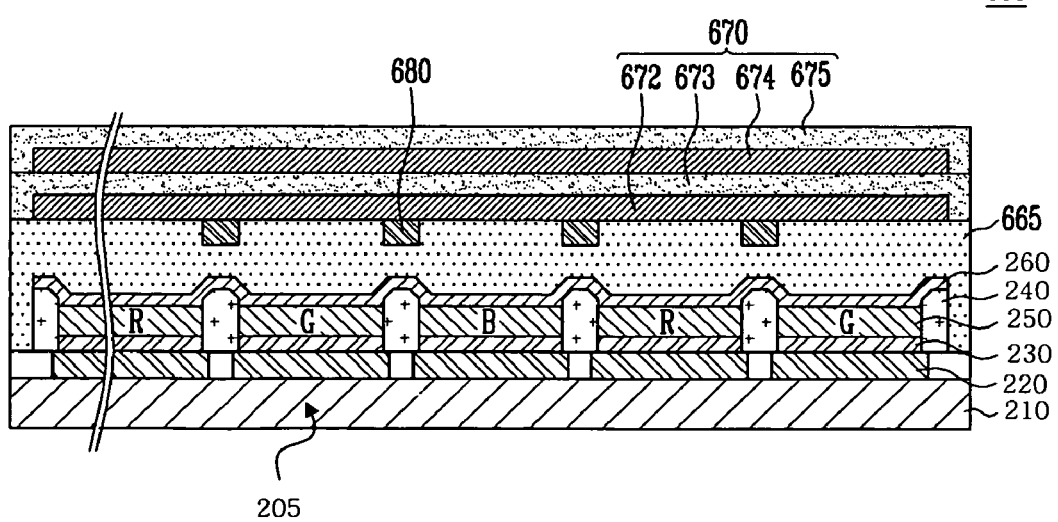
FIG. 7 is a cross-sectional view of an organic light emitting display, according to a fourth exemplary embodiment of the present invention.

FIG. 7 is a cross-sectional view of an organic light emitting display 600, according to a fourth exemplary embodiment of the present invention. The organic light emitting display 600 is similar to the organic light emitting display 200. Similar components have the same reference numbers, and are not described in detail. Referring to FIG. 7, the organic light emitting display 600 includes a substrate 210, thin film transistors (TFTs) 220 formed on the substrate 210, organic light emitting diodes (OLEDs) 205 formed on the TFTs, a protecting layer 665 formed on the OLEDs 205, an encapsulating unit 670 formed on the protecting layer 665, and spacers 680 formed on one side of the encapsulating unit 670. The OLEDs 205 include: first electrodes 230 electrically connected to the TFTs 220; a pixel defining layer 240 formed around the first electrodes 230; organic thin layers 250 formed on the first electrodes 130; and second electrodes 260 formed on the organic thin layers 250. The spacers 680 face a portion of the pixel defining layer 240.

The encapsulating unit 670 faces the substrate 210, and is separated from the second electrodes 660, by the protecting layer 665. The encapsulating unit 670 can be formed of an encapsulating thin layer. The protecting layer 665 planarizes a contact surface of the OLEDs 205, and improves the bonding of the encapsulating unit, thereto. The protecting layer 665 can be formed of one selected from the group consisting of an inorganic material, an oxide, a nitride, and an organic material, such as LiF, $SiO_2$, SixNy, SiOxNy, and $Al_2O_3$.

In order to prevent moisture and oxygen from permeating the OLEDs, the encapsulating unit 670 includes organic and inorganic layers, which are laminated together, to form an encapsulating film. The encapsulating unit 670 has a thickness of 1 to 10 μm, so that the thickness of the encapsulating unit 670 can be about 1/30 of the thickness of generally used encapsulating units, which have thicknesses of no less than 200 μm.

For example, encapsulating unit 670 includes a first organic layer 672, a first inorganic layer 673, a second organic layer 674, and a second inorganic layer 675, which are sequentially laminated on the protecting layer 665. The first and second organic layers 672 and 674 prevent cracks from being formed in the first and second inorganic layers 673 and 675, increase the length of a permeation path of moisture and oxygen, and generally strengthen the first and second inorganic layers 673 and 675.

Figure 8:
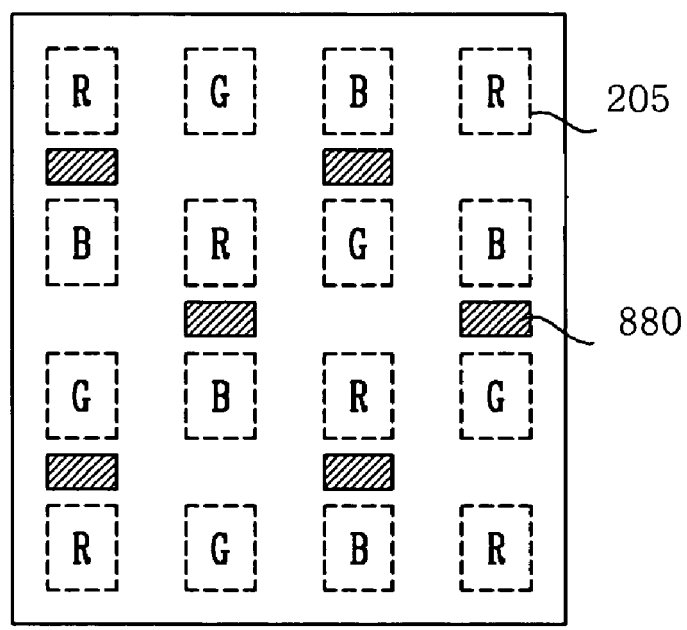
FIG. 8 is a plan view illustrating spacers, according to an exemplary embodiment of the present invention.

FIG. 8 is a plan view illustrating an arrangement of spacers 880, with respect to OLEDs 205, of an exemplary organic light emitting display 800, according to aspects of the present invention. As can be seen in FIG. 8, the spacers 880 are rectangular, and are disposed between pairs of the OLEDs 205. In more detail, the OLEDs 205 are arranged in columns, and the spacers are disposed in rows, in every other column of OLEDs 205. In other words, the spacers 880 are disposed between some of the OLEDs 205, in a checkerboard pattern. Because the spacers 880 are not formed between some of the OLEDs 205, production costs can be reduced.

Figure 9:
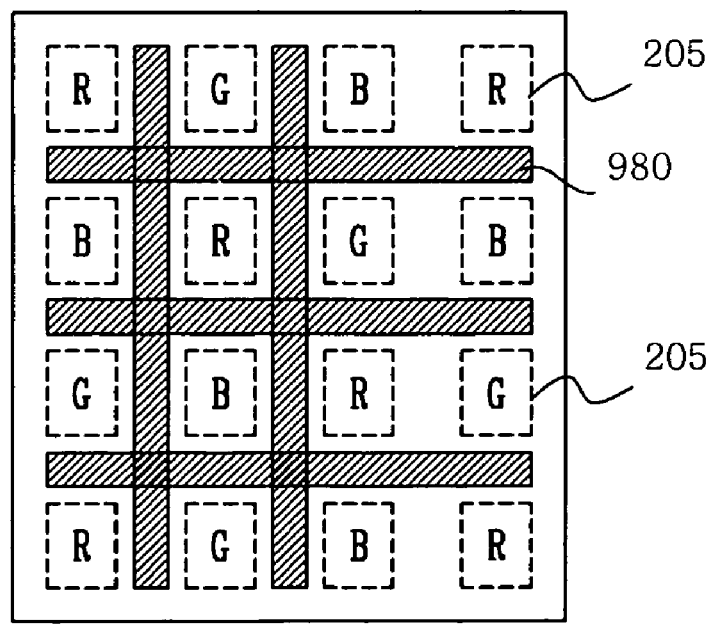
FIG. 9 is a plan view illustrating a spacer, according to an exemplary embodiment of the present invention.

FIG. 9 is a plan view illustrating the arrangement of a spacer 980, with respect to OLEDs 205, of an exemplary organic light emitting display 900, according to aspects of the present invention. Referring to FIG. 9, the spacer 980 is formed as a single unit. The spacer 980 forms a grid pattern, between the OLEDs 205. The spacer 980 is not formed between some of the OLEDs 205, so production costs can be reduced. In other words, some columns or rows of the grid pattern may be omitted, however, the spacer 580 can form a complete grid in some exemplary embodiments.

Figure 10:
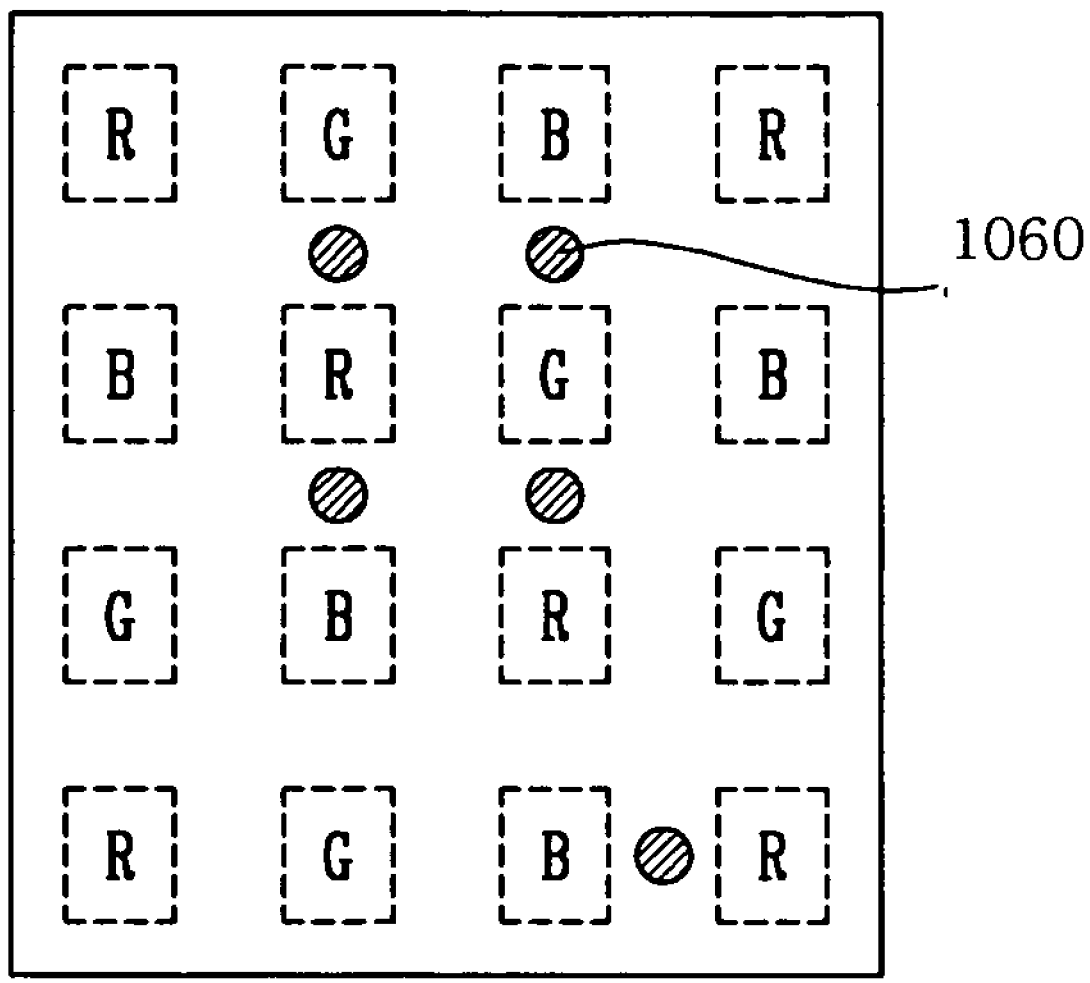
FIG. 10 is a plan view illustrating spacers according, to an exemplary embodiment of the present invention.

FIG. 10 is a plan view illustrating an arrangement of spacers 1080, with respect to OLEDs 205, of an exemplary organic light emitting display 1000, according to aspects of the present invention. Referring to FIG. 10, the spacers 1080 are generally circular, and are disposed between some of the OLEDs 205, in groups of 4.

According to aspects of the present invention, various shapes and arrangements of spacers have been described, to prevent OLEDs from being damaged. However, the present invention is not limited to spacers of any particular shape or arrangement. For example, the spacers can be oval, rod-shaped, polygonal, or irregularly shaped. The spacers are formed of a moisture absorbing material, to protect the OLEDs from oxygen and/or moisture, and to prevent an encapsulating unit from contacting second electrodes of the OLEDs. The moisture absorbing material can also absorb oxygen. The spacers can also improve the mechanical reliability of the OLEDs.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting display comprising:
   a substrate;
   thin film transistors (TFTs) disposed on the substrate;
   organic light emitting diodes (OLEDs) disposed on the TFTs, the OLEDs comprising,
      first electrodes electrically connected to the TFTs,
      a pixel defining layer disposed around the first electrodes,
      organic layers formed on the first electrodes, and
      second electrodes formed on the organic layers;
   an encapsulating unit disposed on the substrate, to encapsulate the OLEDs; and
   a spacer formed of a moisture absorbing material, disposed on the encapsulating unit, facing the pixel defining layer, the spacer prevents the encapsulating unit from contacting the second electrodes when pressure is applied and the spacer does not contact the pixel defining layer or the second electrodes.

2. The organic light emitting display as claimed in claim 1, wherein the spacer is formed in the internal surface of the encapsulating unit corresponding to the pixel defining layer.

3. The organic light emitting display as claimed in claim 1, wherein the pixel defining layer has a thickness of 0.05 to 0.3 μm.

4. The organic light emitting display as claimed in claim 1, wherein the moisture absorbing material is at least one selected from the group consisting of barium oxide, potassium oxide, calcium oxide, aluminum oxide, lithium sulfate, sodium hydrosulfite, calcium sulfate, magnesium sulfate, cobalt sulfate, gallium sulfate, titanium sulfate, calcium chloride, calcium nitrate tetrahydrate, magnesium oxide, alkali metal oxide, alkali earth metal oxide, metal halide, lithium sulfate, a metal chloride, a metal perchlorate, phosphorous pentoxide, and nickel sulfate.

5. The organic light emitting display as claimed in claim 1, wherein the spacer has a thickness of 3 to 5 µm.

6. The organic light emitting display as claimed in claim 1, further comprising a plurality of the spacers.

7. The organic light emitting display as claimed in claim 1, wherein the encapsulating unit is a rectangular prism having an open end.

8. The organic light emitting display as claimed in claim 1, wherein the encapsulating unit is a laminated layer comprising at least one organic layer and at least one inorganic layer.

9. The organic light emitting display as claimed in claim 7, further comprising a sealing material to attach the substrate to the encapsulating unit, disposed between the substrate and the encapsulating unit.

10. The organic light emitting display as claimed in claim 9, wherein the sealing material is an inorganic sealing material.

11. The organic light emitting display as claimed in claim 1, wherein the spacer is disposed on the encapsulating unit in a grid pattern.

12. The organic light emitting display as claimed in claim 6, wherein the spacers are disposed on the encapsulating unit in a checkerboard pattern, or in groups of 4.

13. A method of fabricating an organic light emitting display comprising:
   forming first electrodes on thin film transistors (TFTs) of a substrate;
   forming a pixel defining layer around the first electrodes;
   forming organic layers on the first electrodes;
   forming second electrodes on the organic layers;
   forming a spacer comprising a moisture absorbing material, on an encapsulating unit; and
   attaching the encapsulating unit to the substrate, wherein, the spacer disposed to face at least a portion of the pixel defining layer, prevents the encapsulating unit from contacting the second electrodes when pressure is applied and does not contact the pixel defining layer or the second electrodes.

14. The method as claimed in claim 13, wherein the organic layers are formed by laser induced thermal imaging (LITI).

15. The method as claimed in claim 13, wherein the pixel defining layer has a thickness of 0.05 to 0.3 µm.

16. The method as claimed in claim 13, wherein the moisture absorbing material is at least one selected from the group consisting of barium oxide, potassium oxide, calcium oxide, aluminum oxide, lithium sulfate, sodium hydrosulfite, calcium sulfate, magnesium sulfate, cobalt sulfate, gallium sulfate, titanium sulfate, calcium chloride, calcium nitrate tetrahydrate, magnesium oxide, alkali metal oxide, alkali earth metal oxide, metal halide, lithium sulfate, a metal chloride, a metal perchlorate, phosphorous pentoxide, and nickel sulfate.

17. The method as claimed in claim 13, wherein the spacer has a thickness of 3 to 5 mm.

18. The method as claimed in claim 13, wherein the spacer is formed by one of a deposition method, a screen printing method, and a spraying method.

19. The method as claimed in claim 13, wherein the spacer is formed using a shadow mask.

20. An organic light emitting display comprising:
   a substrate;
   thin film transistors (TFTs) disposed on the substrate;
   a pixel defining layer disposed on the TFT;
   first electrodes disposed on the TFTs and exposed through the pixel defining layer;
   organic layers disposed on the first electrodes, and
   second electrodes disposed on the organic layers;
   an encapsulating unit disposed on the substrate, and spaced apart from the second electrodes; and
   a spacer disposed on the encapsulating unit, facing the pixel defining layer, to absorb oxygen and moisture present between the encapsulating unit and the substrate, the spacer prevents the encapsulating unit from contacting the second electrodes when pressure is applied and the spacer does not contact the pixel defining layer or the second electrodes.

21. The organic light emitting display as claimed in claim 20, wherein the spacer prevents the encapsulating unit from contacting the second electrodes, if the encapsulating unit is pressed toward the substrate forcing the spacer towards the pixel defining layer.

22. The organic light emitting display as claimed in claim 20, wherein the spacer comprises at least one selected from the group consisting of barium oxide, potassium oxide, calcium oxide, aluminum oxide, lithium sulfate, sodium hydrosulfite, calcium sulfate, magnesium sulfate, cobalt sulfate, gallium sulfate, titanium sulfate, calcium chloride, calcium nitrate tetrahydrate, magnesium oxide, alkali metal oxide, alkali earth metal oxide, metal halide, lithium sulfate, a metal chloride, a metal perchlorate, phosphorous pentoxide, and nickel sulfate.

23. The organic light emitting display as claimed in claim 20, wherein a plurality of the spacers are disposed on the encapsulating unit.

24. The organic light emitting display as claimed in claim 20, further comprising a protecting layer disposed between the second electrodes and the encapsulating unit.

25. The organic light emitting display as claimed in claim 20, wherein the pixel defining layer has a thickness of 0.05 to 0.3 µm, and the spacer has a thickness of 3 to 5 µm.

* * * * *